United States Patent
Maekawa et al.

(10) Patent No.: US 10,612,139 B2
(45) Date of Patent: Apr. 7, 2020

(54) METHOD OF FORMING A TUNGSTEN FILM HAVING A LOW RESISTANCE

(71) Applicant: TOKYO ELECTRON LIMITED, Tokyo (JP)

(72) Inventors: Koji Maekawa, Nirasaki (JP); Takashi Sameshima, Nirasaki (JP); Shintaro Aoyama, Fuchu (JP); Mikio Suzuki, Nirasaki (JP); Susumu Arima, Nirasaki (JP); Atsushi Matsumoto, Nirasaki (JP); Naoki Shibata, Nirasaki (JP)

(73) Assignee: TOKYO ELECTRON LIMITED, Tokyo (JP)

(*) Notice: Subject to any disclaimer, the term of this patent is extended or adjusted under 35 U.S.C. 154(b) by 15 days.

(21) Appl. No.: 15/962,463

(22) Filed: Apr. 25, 2018

(65) Prior Publication Data
US 2018/0312972 A1  Nov. 1, 2018

(30) Foreign Application Priority Data
Apr. 26, 2017  (JP) .................. 2017-087173

(51) Int. Cl.
*H01L 21/44* (2006.01)
*C23C 16/455* (2006.01)
(Continued)

(52) U.S. Cl.
CPC .... *C23C 16/45525* (2013.01); *C23C 16/0281* (2013.01); *C23C 16/045* (2013.01); *C23C 16/08* (2013.01); *C23C 16/14* (2013.01); *C23C 16/45527* (2013.01); *H01L 21/28556* (2013.01); *H01L 21/28562* (2013.01); *H01L 21/76876* (2013.01); *H01L 21/76877* (2013.01)

(58) Field of Classification Search
CPC .................. C23C 16/45525; H01L 21/44
USPC ........................................... 438/680
See application file for complete search history.

(56) References Cited

U.S. PATENT DOCUMENTS 7,985,605 B2* 7/2011 Komori ............... H01L 27/1214
                                                          438/22
8,168,539 B2* 5/2012 Sugiura .................. C23C 16/14
                                                          438/656
(Continued)

FOREIGN PATENT DOCUMENTS

JP  2005-518088 A   6/2005
JP  2005-533181 A   11/2005
(Continued)

*Primary Examiner* — Caleb E Henry
(74) *Attorney, Agent, or Firm* — Nath, Goldberg & Meyer; Jerald L. Meyer (57) ABSTRACT

There is provided a tungsten film forming method which includes: forming a first tungsten film on a substrate; and forming a second tungsten film on the first tungsten film. The forming a first tungsten film includes alternately supplying a first raw material gas containing tungsten and a diborane gas together with a first carrier gas to the substrate. The forming a second tungsten film includes alternately supplying a second raw material gas containing tungsten and a hydrogen gas together with a second carrier gas to the substrate on which the first tungsten film is formed. The first carrier gas is a nitrogen gas. The second carrier gas includes at least one kind of nobel gas and has the noble gas at a flow rate of 70% or more with respect to a total flow rate of the second carrier gas.

5 Claims, 5 Drawing Sheets (51) Int. Cl.
   *C23C 16/02*    (2006.01)
   *H01L 21/768*   (2006.01)
   *H01L 21/285*   (2006.01)
   *C23C 16/08*    (2006.01)
   *C23C 16/14*    (2006.01)
   *C23C 16/04*    (2006.01)

(56) References Cited

U.S. PATENT DOCUMENTS 9,159,571 B2 *  10/2015  Humayun ......... H01L 21/67207
9,236,297 B2 *  1/2016   Chen ................ C23C 16/0272

FOREIGN PATENT DOCUMENTS

JP   2007-46134 A    2/2007
KR   2001-0012627 A  2/2001

\* cited by examiner

METHOD OF FORMING A TUNGSTEN FILM HAVING A LOW RESISTANCE

CROSS-REFERENCE TO RELATED APPLICATION

This application is based upon and claims the benefit of priority from Japanese Patent Application No. 2017-087173, filed on Apr. 26, 2017, the entire contents of which are incorporated herein by reference.

TECHNICAL FIELD

The present disclosure relates to a method of forming a tungsten film.

BACKGROUND

In the manufacture of electronic devices such as semiconductor devices or the like, a metal film is formed on a substrate. The metal film is used as, for example, a wiring layer. A tungsten film is known as such a metal film.

Various methods of forming a tungsten film have been used. Tungsten films formed using such methods includes a first tungsten film and a second tungsten film. In these methods, a raw material gas containing tungsten and a reducing gas are alternately supplied to a substrate together with a carrier gas. As a result, the first tungsten film is formed. The raw material gas contains tungsten hexafluoride, and the reducing gas is a hydrogen-containing gas such as diborane or the like. Subsequently, a raw material gas containing tungsten and a reducing gas are alternately supplied to the substrate together with a carrier gas. As a result, a second tungsten film is formed on the first tungsten film. In the formation of the second tungsten film, the raw material gas contains tungsten hexafluoride, and the reducing gas is hydrogen gas. The carrier gas used in forming the first and second tungsten films is an inert gas such as a nitrogen gas or a noble gas.

As described above, the tungsten film is used as, for example, a wiring layer. Therefore, the tungsten film resistance needs to be low.

SUMMARY

According to one embodiment of the present disclosure, there is provided a tungsten film forming method, including: forming a first tungsten film on a substrate; and forming a second tungsten film on the first tungsten film, wherein the forming a first tungsten film includes alternately supplying a first raw material gas containing tungsten and a diborane gas together with a first carrier gas to the substrate, the forming a second tungsten film includes alternately supplying a second raw material gas containing tungsten and a hydrogen gas together with a second carrier gas to the substrate on which the first tungsten film is formed, the first carrier gas being a nitrogen gas, and the second carrier gas including at least one kind of noble gas and the noble gas is supplied at a flow rate of 70% or more with respect to a total flow rate of the second carrier gas.ph:

BRIEF DESCRIPTION OF DRAWINGS

The accompanying drawings, which are incorporated in and constitute a portion of the specification, illustrate embodiments of the present disclosure, and together with the general description given above and the detailed description of the embodiments given below, serve to explain the principles of the present disclosure.

DETAILED DESCRIPTION

Reference will now be made in detail to various embodiments, examples of which are illustrated in the accompanying drawings. In the figures, the same or corresponding parts will be denoted by the same reference numerals. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

Figure 1:
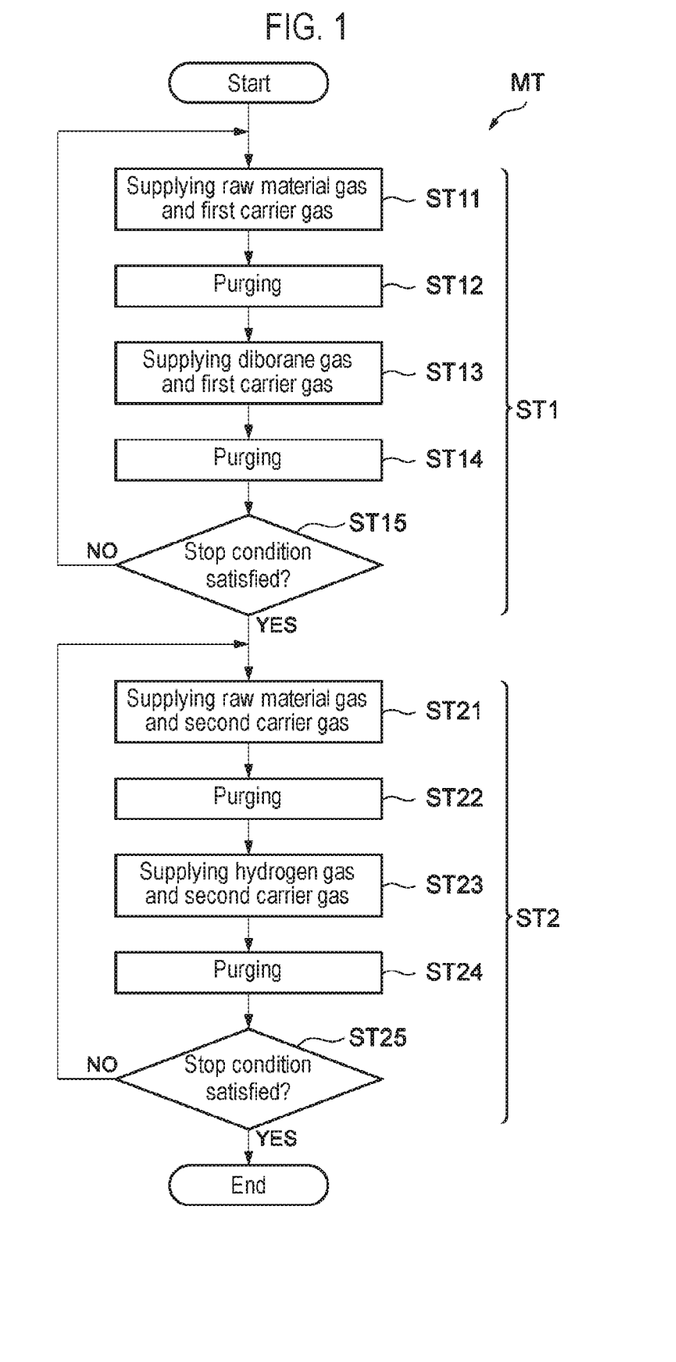
FIG. 1 is a flowchart illustrating a tungsten film forming method according to an embodiment.

FIG. 1 is a flowchart illustrating a tungsten film forming method according to an embodiment. A method MT shown in FIG. 1 is executed to form a tungsten film on a substrate. The tungsten film formed by the method MT is used as, for example, a wiring layer.

Figure 2:
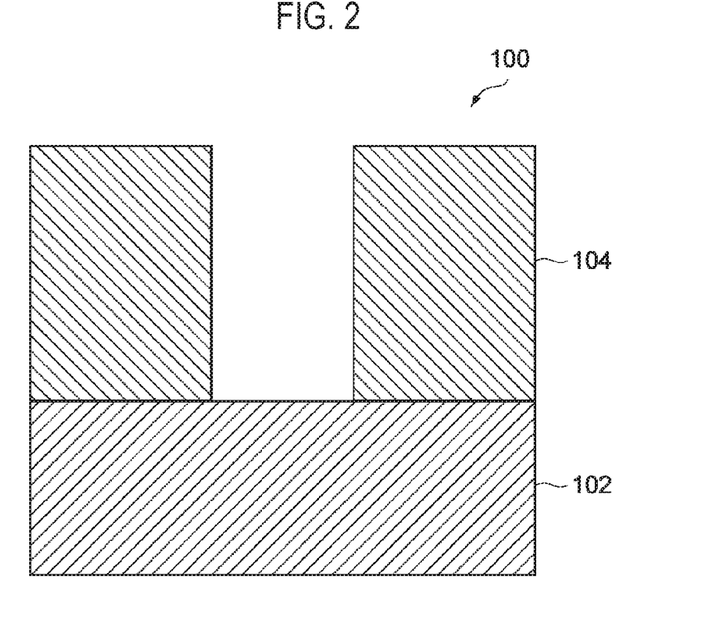
FIG. 2 is an enlarged sectional view showing a portion of an exemplary substrate to which the method shown in FIG. 1 can be applied.

FIG. 2 is an enlarged sectional view showing a portion of an exemplary substrate to which the method shown in FIG. 1 can be applied. A substrate 100 shown in FIG. 2 includes a base layer 102 and an insulating layer 104. The insulating layer 104 is provided on the base layer 102. The insulating layer 104 is made of an insulating material such as silicon oxide or the like. An opening is formed in the insulating layer 104. The opening may be a hole or a groove.

Figure 3A:
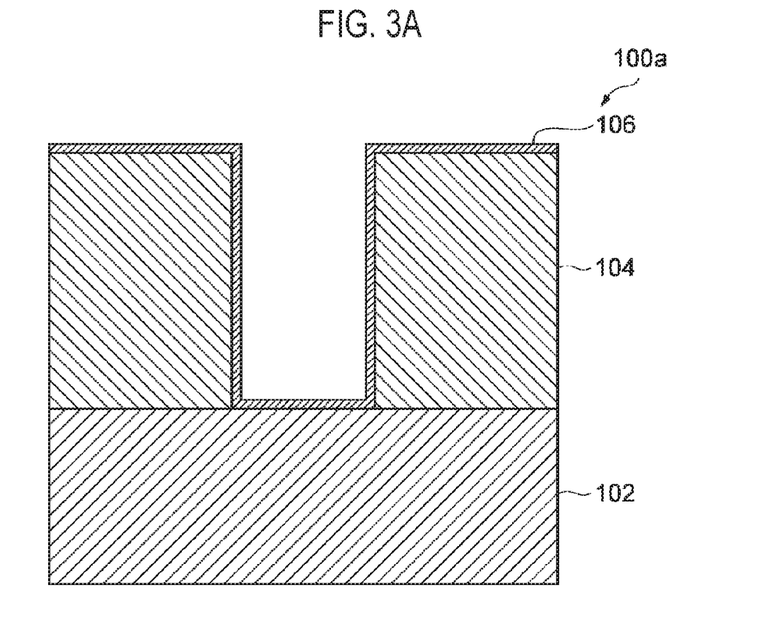
FIG. 3A is an enlarged sectional view showing a portion of the exemplary substrate after step ST1 of the method shown in FIG. 1 is executed.
Figure 3B:
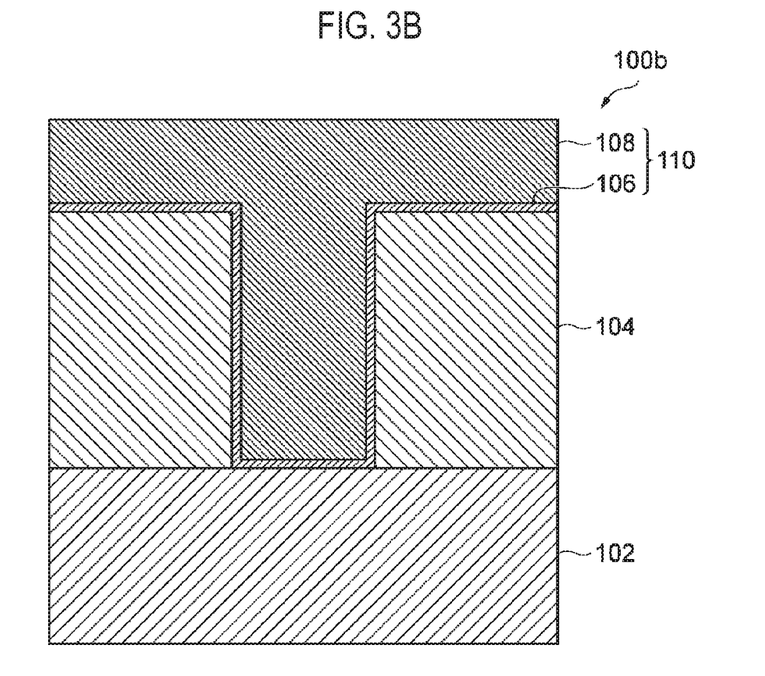
FIG. 3B is an enlarged sectional view showing a portion of the exemplary substrate after step ST2 of the method shown in FIG. 1 is executed.

Hereinafter, the method MT will be described by taking, as an example, a case where the method MT is applied to the substrate 100. The method MT may be applied to any arbitrary substrate on which a tungsten film needs to be formed. In the following description, reference is made to FIGS. 3A and 3B in addition to FIG. 1. FIG. 3A is an enlarged sectional view showing a portion of the exemplary substrate after step ST1 of the method shown in FIG. 1 is executed, and FIG. 3B is an enlarged sectional view showing a portion of the exemplary substrate after step ST2 of the method shown in FIG. 1 is executed.

As shown in FIG. 1, the method MT includes steps ST1 and ST2. In step ST1, a first tungsten film 106 is formed on the substrate 100. In step ST1, the first tungsten film 106 is formed by a film forming process performed on the substrate 100 accommodated in a chamber. The first tungsten film 106 is a nucleation film. The first tungsten film 106 may have a higher resistance value than a second tungsten film 108 to be described later. Therefore, the first tungsten film 106 is formed to have a smaller film thickness than that of the second tungsten film 108. The film thickness of the first tungsten film 106 falls within a range of, for example, 1 nm to 5 nm.

Step ST1 includes steps ST11 and ST13. In step ST1, a raw material gas containing tungsten and a diborane ($B_2H_6$) gas are alternately supplied to the substrate 100 together with a first carrier gas. Step ST1 may further include step ST12 executed between steps ST11 and ST13, and step ST14 executed between steps ST13 and ST11. In step ST1, a sequence including steps ST11 to ST14 is executed a predetermined number of times (predetermined number of cycles).

Step ST1 is executed in a state in which the substrate 100 is accommodated in the chamber. In step ST11, a raw material gas containing tungsten and a first carrier gas are supplied to the substrate 100. The raw material gas may be, for example, a tungsten hexafluoride ($WF_6$) gas or a tungsten hexachloride ($WCl_6$) gas. The first carrier gas is a nitrogen ($N_2$) gas. By virtue of step ST11, a first raw material containing tungsten in the raw material gas is deposited on the surface of the substrate 100.

Ranges of processing conditions used in step ST11 are shown below by way of example.
   Flow rate of raw material gas in step ST11: 50 sccm to 450 sccm
   Flow rate of first carrier gas in step ST11: 500 scan to 4,500 sccm
   Temperature of substrate in step ST11: 200 degrees C. to 350 degrees C.
   Pressure of chamber in step ST11: 100 Pa to 1,250 Pa
   Processing time of step ST11 in each cycle: 0.5 seconds to 5 seconds In the subsequent step ST12, the chamber is purged. That is to say, the gas inside the chamber is replaced by a purge gas from the raw material gas. The purge gas used in step ST12 is an inert gas. The purge gas used in step ST12 may be the same gas as the first carrier gas used in step ST11. That is to say, in steps ST11 and ST12, the first carrier gas may be continuously supplied to the chamber. The first carrier gas may be supplied to the chamber during the execution of step ST1, namely in a sequence of step ST11 to step ST14.

In the subsequent step ST13, a diborane gas and the first carrier gas are supplied to the substrate 100. By virtue of step ST13, elements other than tungsten in the first raw material existing on the substrate 100 are removed, and a first tungsten film (a portion of the first tungsten film in each cycle) is formed on the substrate 100a.

Ranges of processing conditions used in step ST13 are shown below by way of example.
   Flow rate of diborane gas in step ST13: 50 sccm to 4,500 sccm
   Flow rate of first carrier gas in step ST13: 50 sccm to 4,500 sccm
   Temperature of substrate in step ST13: 200 degrees C. to 350 degrees C.
   Pressure of chamber in step ST13: 100 Pa to 1,250 Pa
   Processing time of step ST13 in each cycle: 0.5 seconds to 5 seconds In the subsequent step ST14, the chamber is purged: That is to say, the gas inside the chamber is replaced by a purge gas from the nitriding gas. The purge gas used in step ST14 is an inert gas. The purge gas used in step ST14 may be the first carrier gas.

In the subsequent step ST15, it is determined whether or not a stop condition is satisfied. The stop condition is satisfied when the number of executions of the sequence of step ST11 to step ST14 has reached a predetermined number of times (predetermined number of cycles). The predetermined number of times may be, for example, 1 to 50 times. If the stop condition is not satisfied, step ST11 is executed again. When the stop condition is satisfied, the execution of step ST1 is terminated. Through the execution of step ST1, the first tungsten film 106 is formed on the substrate 100 as shown in FIG. 3A. Hereinafter, the substrate 100 on which the first tungsten film 106 is formed will be referred to as a substrate 100a.

Subsequently, step ST2 of the method MT is executed. In step ST2, a second tungsten film 108 is formed on the first tungsten film 106. In step ST2, a film forming process is performed on the substrate 100a inside the chamber. Thus, the second tungsten film 108 is formed. The chamber used in step ST2 may be the same as or different from the chamber used in step ST1.

Step ST2 includes steps ST21 and ST23. In step ST2, a raw material gas containing tungsten and a hydrogen ($H_2$) gas are alternately supplied to the substrate 100a together with a second carrier gas. Step ST2 may further include step ST22 executed between steps ST21 and ST23, and step ST24 executed between steps ST23 and ST21. In step ST2, a sequence of steps ST21 to ST24 is executed a predetermined number of times (predetermined number of cycles).

Step ST2 is executed in a state in which the substrate 100a is accommodated in the chamber. In step ST21, a raw material gas containing tungsten and a second carrier gas are supplied to the substrate 100a. The raw material gas may be, for example, a tungsten hexafluoride ($WF_6$) gas or a tungsten hexachloride ($WCl_6$) gas. The second carrier gas is composed of at least one kind of noble gas and contains the noble gas at a flow rate of 70% or more with respect to the total flow rate of the second carrier gas. The second carrier gas may contain the noble gas at a flow rate of 95% or more with respect to the total flow rate of the second carrier gas. The second carrier gas may contain only the noble gas. The noble gas is, for example, an argon gas, but may be any noble gas. By virtue of step ST21, the second raw material containing tungsten in the raw material gas is deposited on the first tungsten film 106.

Ranges of processing conditions used in step ST21 are shown below by way of example.
   Flow rate of raw material gas in step ST21: 50 sccm to 4,500 sccm
   Flow rate of second carrier gas in step ST21: 500 sccm to 4,500 sccm
   Temperature of substrate in step ST21: 300 degrees C. to 530 degrees C.
   Pressure of chamber in step ST21: 100 Pa to 1,250 Pa.
   Processing time of step ST21 in each cycle: 0.05 seconds to 5 seconds In the subsequent step ST22, the chamber is purged. That is to say, the gas inside the chamber is replaced by a purge gas from the raw material gas. The purge gas used in step ST22 is an inert gas. The purge gas used in step ST22 may be the same gas as the second carrier gas used in step ST21. That is to say, in steps ST21 and ST22, the second carrier gas may be continuously supplied to the chamber. The second carrier gas may be supplied to the chamber during the execution of step ST2, namely in a sequence of steps ST21 to ST24.

In the subsequent step ST23, a hydrogen gas and the second carrier gas are supplied to the substrate 100a. In step ST23, elements other than tungsten in the second raw material are removed, and a second tungsten film (a portion of the second tungsten film in each cycle) is formed on the first tungsten film 106 of the substrate 100a.

Ranges of processing conditions used in step ST23 are shown below by way of example.

Flow rate of hydrogen gas in step ST23: 500 sccm to 9,000 sccm
Flow rate of second carrier gas in step ST23: 500 sccm to 4,500 sccm
Temperature of substrate in step ST23: 300 degrees C. to 530 degrees C.
Pressure of chamber in step ST23: 100 Pa to 1,250 Pa
Processing time of step ST23 in each cycle: 0.05 seconds to 5 seconds In the subsequent step ST24, the chamber is purged. That is to say, the gas inside the chamber is replaced by a purge gas from the hydrogen gas. The purge gas used in step ST24 is an inert gas. The purge gas used in step ST24 may be the second carrier gas.

In the subsequent step ST25, it is determined whether or not a stop condition is satisfied. The stop condition is satisfied when the number of executions of the sequence of step ST21 to step ST24 has reached a predetermined number of times (predetermined number of cycles). The predetermined number of times depends on the film thickness of the second tungsten film 108 to be formed, and may be, for example, 30 times to 3,000 times. If the stop condition is not satisfied, step ST21 is executed again. If the stop condition is satisfied, the execution of step ST2 is terminated. By the execution of step ST2, the second tungsten film 108 is formed on the first tungsten film 106 so that a substrate 100b shown in FIG. 3B is obtained. That is to say, a tungsten film 110 including the first tungsten film 106 and the second tungsten film 108 is formed on the substrate 100.

Since nitrogen contained in the first carrier gas is introduced into the first tungsten film 106, the size of crystal grains of tungsten in the first tungsten film 106 decreases. Therefore, the first tungsten film 106 has a relatively high resistance. However, the thickness of the first tungsten film formed per cycle of the supply of the raw material gas and the supply of the diborane gas is reduced. Thus, according to the method MT, it is possible to reduce the film thickness of the first tungsten film 106. Since the second carrier gas mainly containing a noble gas is used for forming the second tungsten film 108, the size of crystal grains of tungsten in the second tungsten film 108 increases. Therefore, the resistance of the second tungsten film 108 decreases. In the method MT, since the tungsten film 110 including the first tungsten film 106 and the second tungsten film 108 is formed, it is possible to provide the tungsten film 110 having a low resistance.

Figure 4:
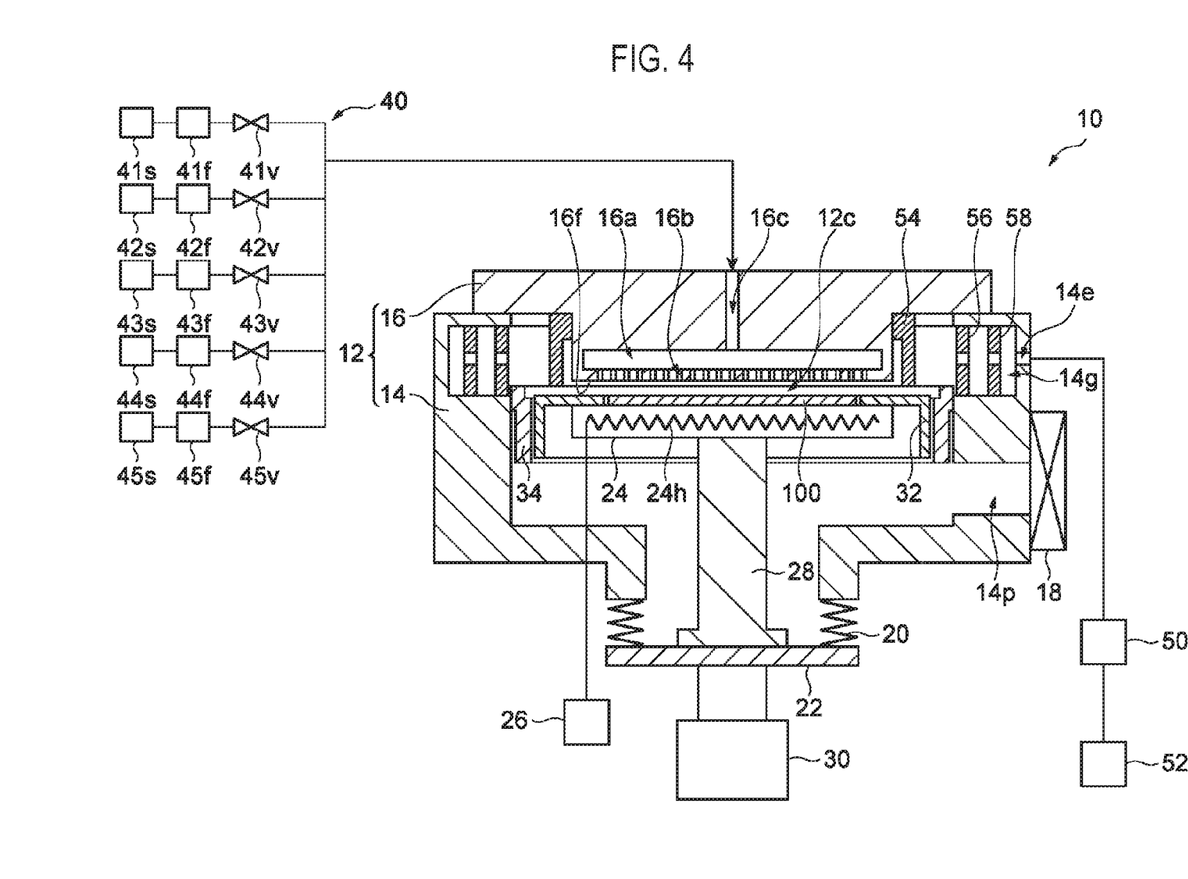
FIG. 4 is a view showing an exemplary film forming apparatus that can be used in executing the method shown in FIG. 1.

Hereinafter, a film forming apparatus that can be used in the execution of the method MT will be described. FIG. 4 is a view showing an exemplary film forming apparatus that can be used in the execution of the method shown in FIG. 1. Steps ST1 and ST2 of the method MT can be executed by using the film forming apparatus 10 shown in FIG. 4.

The film forming apparatus 10 includes a chamber body 12. A chamber 12c is provided within the chamber body 12. The chamber body 12 includes a main portion 14 and a ceiling portion 16. The main portion 14 constitutes a side wall of the chamber body 12. The main portion 14 has a substantially cylindrical shape and extends in the vertical direction. The main portion 14 is made of metal such as, for example, aluminum or the like. A corrosion-resistant film is formed on an inner wall surface of the main portion 14.

An opening 14p through which the substrate 100 is loaded into and unloaded from the chamber 12c is formed in the main portion 14, namely the side wall of the chamber body 12. The opening 14p can be opened and closed by a gate valve 18. A lower end portion of the main portion 14 is opened. One end (upper end) of a bellows 20 is coupled to the lower end portion of the main portion 14. The other end (lower end) of the bellows 20 is coupled to a lid 22. The lid 22 is a substantially plate-like member. The bellows 20 and the lid 22 hermetically seal the opening of the lower end portion of the main portion 14 so as to ensure airtightness of the chamber 12c. In addition, the upper end portion of the main portion 14 is opened. The ceiling portion 16 is coupled to the upper end portion of the main portion 14. The ceiling portion 16 hermetically seals the opening of the upper end portion of the main portion 14 so as to ensure airtightness of the chamber 12c. The ceiling portion 16 is made of metal such as, for example, aluminum or the like. A corrosion-resistant film is formed on an inner wall surface of the ceiling portion 16.

A stage 24 is provided inside the chamber 12c. The stage 24 has a substantially disk-like shape. The substrate 100 is mounted on an upper surface of the stage 24. A heater 24h is provided inside the stage 24. The heater 24h is electrically connected to a heater power source 26. The heater power source 26 is provided outside the chamber body 12.

One end (upper end) of a shaft body 28 is coupled to the stage 24. The shaft body 28 extends downward from the stage 24. The other end (lower end) of the shaft body 28 is coupled to the lid 22. A driving device 30 provided outside the chamber body 12 is coupled to the lid 22. The driving device 30 is configured to vertically move the stage 24 via the lid 22 and the shaft body 28. The driving device 30 may include, for example, a motor and a driving shaft coupled to the motor in order to move the stage 24 up and down.

A ring member 32 is attached to the stage 24. An upper portion of the ring member 32 defines a circular opening. The ring member 32 is provided so as to surround the substrate 100 mounted on the stage 24 by the upper portion of the ring member 32. A cylindrical body 34 is attached to the main portion 14, namely the side wall of the chamber body 12. The cylindrical body 34 has a substantially cylindrical shape and is provided inside the chamber 12c and outside the ring member 32. The cylindrical body 34 is provided coaxially with the ring member 32 so that a clearance exists between the cylindrical body 34 and the ring member 32.

The ceiling portion 16 includes a wall surface 16f that defines the chamber 12c from above. The wall surface 16f extends above the stage 24 and faces the upper surface of the stage 24. The film forming apparatus 10 is configured such that a gap length between the upper surface of the stage 24 and the wall surface 16f can be changed by the vertical movement of the stage 24 described above.

A gas diffusion space 16a is formed inside the ceiling portion 16. A plurality of gas discharge holes 16b is formed in the ceiling portion 16. The gas discharge holes 16b are holes for discharging the gas supplied into the gas diffusion chamber 16a toward the chamber 12c and extend from the gas diffusion chamber 16a to the wall surface 16f. Further, a gas line 16c is formed in the ceiling portion 16. The gas line 16c is connected to the gas diffusion chamber 16a. A gas supply system 40 is connected to the gas line 16c.

The gas supply system 40 includes flow rate controllers 41f, 42f, 43f, 44f and 45f, and valves 41v, 42v, 43v, 44v and 45v. Each of the flow rate controllers 41f, 42f, 43f, 44f and 45f is a mass flow controller or a pressure-controlled flow controller.

A gas source 41s is connected to an input side of the flow rate controller 41f. The gas source 41s is a source of the aforementioned raw material gas. An output side of the flow rate controller 41f is connected to the gas line 16c via the valve 41v. A gas source 42s is connected to an input side of the flow rate controller 42f. The gas source 42s is a source of the aforementioned diborane gas. An output side of the flow rate controller 42f is connected to the gas line 16c via the valve 42v. A gas source 43s is connected to an input side of the flow rate controller 43f The gas source 43s is a source of the aforementioned hydrogen gas. An output side of the flow rate controller 43f is connected to the gas line 16c via the valve 43v.

A gas source 44s is connected to an input side of the flow rate controller 44f. The gas source 44s is a source of the aforementioned nitrogen gas. An output side of the flow rate controller 44f is connected to the gas line 16c via the valve 44v. The nitrogen gas supplied from the gas source 44s is used as the aforementioned first carrier gas. A gas source 45s is connected to an input side of the flow rate controller 45f. The gas source 45s is a source of a noble gas, for example, a source of an argon gas. An output side of the flow rate controller 45f is connected to the gas line 16c via the valve 45v. The noble gas supplied from the gas source 44s is used as a gas constituting the aforementioned second carrier gas. The second carrier gas may contain the nitrogen gas supplied from the gas source 44s as a portion thereof.

The gas supply system 40 may control the flow rate of the gas supplied from one or more gas sources selected from the gas sources 41s, 42s, 43s, 44s and 45s, and may supply the gas, the flow rate of which is controlled, to the gas diffusion chamber 16a. The gas supplied to the gas diffusion chamber 16a is discharged from the gas discharge holes 16b toward the substrate 100.

The main portion 14, i.e., the side wall of the chamber body 12, defines a groove 14g extending in the circumferential direction with respect to the central axis of the main portion 14. An exhaust port 14e is formed in a portion of the main portion 14 defining the groove 14g. An exhaust device 52 is connected to the exhaust port 14e via a pressure regulation valve 50. The exhaust device 52 may be a vacuum pump such as a turbo molecular pump or a dry pump.

One or more baffle members are provided inside the chamber 12c. In the example shown in FIG. 4, three baffle members 54, 56 and 58 are provided inside the chamber 12c. The three baffle members 54, 56 and 58 have a substantially cylindrical shape extending in the vertical direction. The three baffle members 54, 56 and 58 are coaxially provided on the center side of the chamber 12c with respect to the exhaust port 14e. An upper end of the baffle member 54 is coupled to the ceiling portion 16. A lower end of the baffle member 54 faces the ring member 32 so as to provide a gap between the lower end of the baffle member 54 and the ring member 32. The baffle member 56 and the baffle member 58 are disposed inside the groove 14g. The baffle member 56 is provided outside the baffle member 54, and the baffle member 58 is provided outside the baffle member 56. Each of the baffle members 56 and 58 has a plurality of through-holes formed therein. The through-holes formed in each of the baffle members 56 and 58 are arranged in the circumferential direction with respect to the central axis of the main portion 14.

In the film forming apparatus 10, the gas discharged from the gas discharge holes 16b is supplied to the substrate 100, and is exhausted from the exhaust port 14e via the gap between the baffle member 54 and the ring member 32, the through-holes of the baffle member 56 and the through-holes of the baffle member 58.

Figure 5:
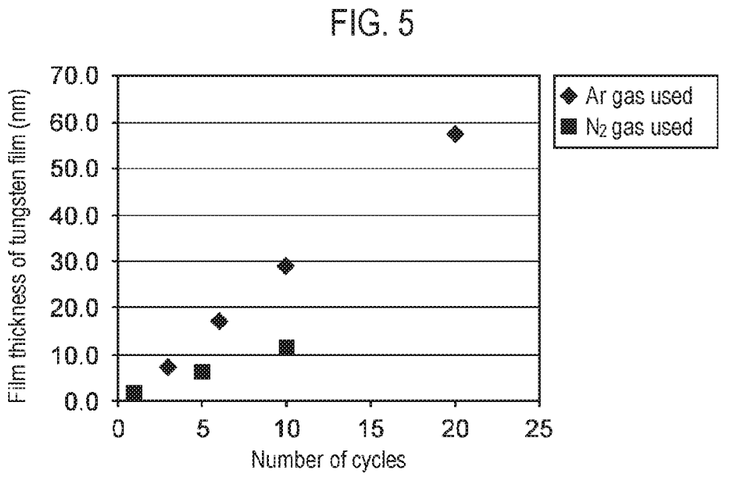
FIG. 5 is a graph showing the results of a first experiment.

Hereinafter, a first experiment conducted to investigate a relationship between the kind of the carrier gas used for forming the tungsten film and the film thickness of the tungsten film will be described. In the first experiment, a tungsten film was formed on a plurality of substrates having a flat surface by using the film forming apparatus 10. A process for forming the tungsten film in the first experiment is a process of executing a sequence of first to fourth steps. The first step is a step of supplying a $WF_6$ gas and a carrier gas to the substrate. The second step following the first step is a step of executing a purging operation with the carrier gas. The third step following the second step is a step of supplying a diborane gas and a carrier gas to the substrate. The fourth step following the third step is a step of executing a purging operation with the carrier gas. In the formation of the tungsten film on some of the plurality of substrates, a nitrogen gas ($N_2$ gas) vas used as the carrier gas, and sequences were executed a different number of times (different numbers of cycles). In the formation of the tungsten film on several other substrates among the plurality of substrates, an argon gas (Ar gas) was used as the carrier gas, and sequences were executed a different number of times (different numbers of cycles). Conditions of the first step and the third step are shown below.

<Conditions of First Step>
Flow rate of $WF_6$, gas: 300 sccm
Flow rate of $N_2$ gas when $N_2$ gas is used: 6,000 sccm
Flow rate of Ar gas when Ar gas is used: 6,000 sccm
Temperature of substrate: 450 degrees C.
Pressure of chamber: 500 Pa
Processing time of first step in each cycle: 1 second <Conditions of Third Step>
Flow rate of diborane gas: 400 sccm
Flow rate of $N_2$ gas when $N_2$ gas is used: 6,000 sccm
Flow rate of Ar gas when Ar gas is used: 6,000 sccm
Temperature of substrate: 450 degrees C.
Pressure of chamber: 500 Pa
Processing time of third step in each cycle: 1 second In the first experiment, the film thicknesses of the tungsten films respectively formed on the plurality of substrates were measured. FIG. 5 is a graph showing the results of the first experiment. In the graph of FIG. 5, the horizontal axis represents the number of times a sequence was executed (the number of cycles), and the vertical axis represents the thickness of the tungsten film formed. As shown in FIG. 5, when the $N_2$ gas is used as the carrier gas, the thickness of the tungsten film formed per cycle is smaller than when the Ar gas is used as the carrier gas. From this, it was confirmed that by using the nitrogen gas as the carrier gas in step ST1, it is possible to control the thickness of the first tungsten film with high precision and to easily form the first tungsten film having a smaller film thickness.

Figure 6:
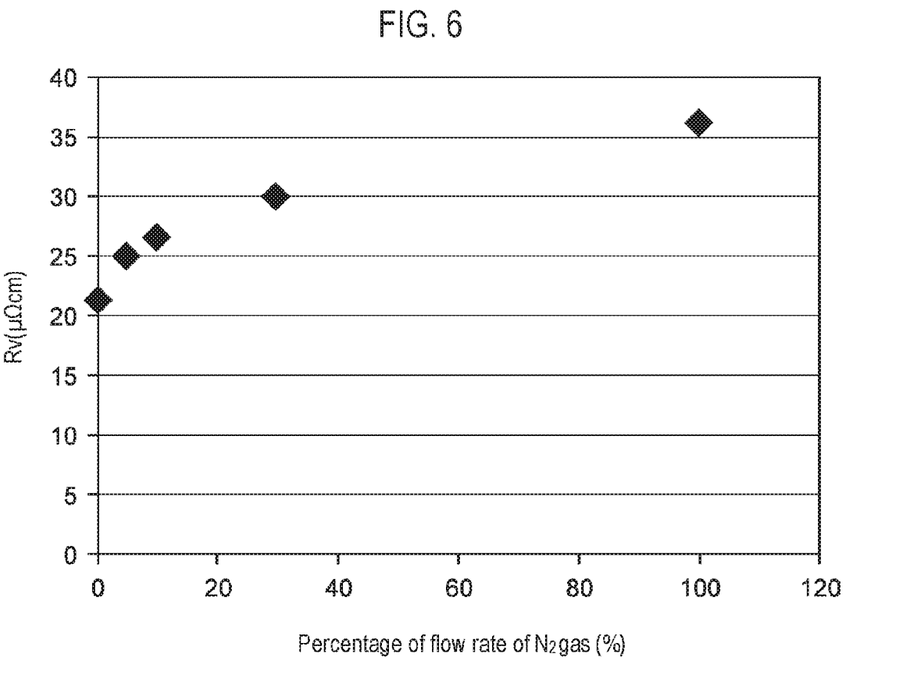
FIG. 6 is a graph showing the resets of a second experiment.

Hereinafter, a second experiment conducted to investigate a relationship between the percentage of the flow rate of the noble gas with respect to the total flow rate of the carrier gas used in the formation of the tungsten film and the resistance of the tungsten film will be described. In the second experiment, a tungsten film was formed on a plurality of substrates having a flat surface by using the film forming apparatus 10. In the second experiment, a process for forming the tungsten film is a process of executing a sequence of first to fourth steps. In the second experiment, the first step is a step of supplying a $WF_6$ gas and a carrier gas to the substrate. The second step following the first step is a step of executing a purging operation with the carrier gas. The third step following the second step is a step of supplying an $H_2$ gas and a carrier gas to the substrate. The fourth step following the third step is a step of executing a purging operation with the carrier gas. In the formation of the tungsten film on the plurality of substrates, different percentages of the flow rate of the $N_2$ gas in the carrier gas with respect to the total flow rate of the carrier gas were applied. When the percentage of the flow rate of the $N_2$ gas is not 100%, the argon gas was used as the balance of the carrier gas. Conditions of the first step and the third step in the second experiment are shown below.

<Conditions of First Step>
  Flow rate of $WF_6$ gas: 180 sccm
  Flow rate of carrier gas: 6,000 sccm
  Temperature of substrate: 450 degrees C.
  Pressure of chamber: 500 Pa
  Processing time of first step in each cycle: 0.15 seconds
<Conditions of Third Step>
  Flow rate of $H_2$ gas: 4,500 sccm
  Flow rate of carrier gas: 6,000 sccm
  Temperature of substrate: 450 degrees C.
  Pressure of chamber: 500 Pa
  Processing time of third step in each cycle: 0.3 seconds In the second experiment, the specific resistance Rv of the tungsten film formed on each of the plurality of substrates was measured. FIG. 6 is a graph showing the results of the second experiment. In the graph of FIG. 6, the horizontal axis represents the percentage (%) of the flow rate of the $N_2$ gas with respect to the total flow rate of the carrier gas, and the vertical axis represents the specific resistance Rv. As shown in FIG. 6, it was confirmed that when the percentage of the flow rate of the $N_2$ gas is 30% or less, namely when the percentage of the flow rate of the argon gas in the carrier gas with respect to the total flow rate of the carrier gas is 70% or more, the specific resistance Rv of the formed tungsten film decreases. Further, it was confirmed that when the percentage of the flow rate of the $N_2$ gas is 5% or less, namely when the percentage of the flow rate of the argon gas in the carrier gas with respect to the total flow rate of the carrier gas is 95% or more, the specific resistance Rv of the tungsten film further decreases. Furthermore, it was confirmed that when the carrier gas contains only the argon gas, the specific resistance Rv of the formed tungsten film even further decreases. From the results of the second experiment, it was confirmed that by setting the percentage of the flow rate of the noble gas in the carrier gas with respect to the total flow rate of the carrier gas used in step ST2 to 70% or more, it is possible to reduce the resistance of the formed tungsten film.

As described above, according to the present disclosure, it is possible to form a tungsten film having a low resistance.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A tungsten film forming method, comprising:
   forming a first tungsten film on a substrate; and
   forming a second tungsten film on the first tungsten film,
   wherein the forming a first tungsten film includes alternately supplying a first raw material gas containing tungsten and a diborane gas together with a first carrier gas to the substrate,
   the forming a second tungsten film includes alternately supplying a second raw material gas containing tungsten and a hydrogen gas together with a second carrier gas to the substrate on which the first tungsten film is formed,
   the first carrier gas is a nitrogen gas, and
   the second carrier gas includes at least one kind of noble gas and the noble gas is supplied at a flow rate of 70% or more with respect to a total flow rate of the second carrier gas.

2. The method of claim 1, wherein the flow rate of the noble gas in the second carrier gas is 95% or more with respect to the total flow rate of the second carrier gas.

3. The method of claim 1, wherein the second carrier gas contains only the noble gas.

4. The method of claim 1, wherein the noble gas is an argon gas.

5. The method of claim 1, wherein the first raw material gas used in the forming a first tungsten film and the second raw material gas used in the forming a second tungsten film includes tungsten hexafluoride.

* * * * *